US008975974B2

(12) United States Patent
Wadhwa

(10) Patent No.: US 8,975,974 B2
(45) Date of Patent: Mar. 10, 2015

(54) LOW VOLTAGE, WIDE FREQUENCY RANGE OSCILLATOR

(75) Inventor: Sameer Wadhwa, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 233 days.

(21) Appl. No.: 13/410,104

(22) Filed: Mar. 1, 2012

(65) Prior Publication Data

US 2013/0229238 A1 Sep. 5, 2013

(51) Int. Cl.
H03K 3/03 (2006.01)
(52) U.S. Cl.
USPC .................. 331/57; 331/175; 331/185
(58) Field of Classification Search
USPC ............. 331/57, 175, 182, 183, 185, 186
See application file for complete search history.

(56) References Cited

U.S. PATENT DOCUMENTS

| 6,094,103 | A | 7/2000 | Jeong et al. | |
|---|---|---|---|---|
| 7,106,142 | B2* | 9/2006 | Lin | 331/57 |
| 7,113,048 | B2* | 9/2006 | Brown et al. | 331/57 |
| 7,126,431 | B2 | 10/2006 | Mintchev et al. | |
| 7,403,057 | B2 | 7/2008 | Cranford, Jr. et al. | |
| 7,592,877 | B2* | 9/2009 | Shiramizu et al. | 331/57 |
| 7,701,301 | B2* | 4/2010 | Lakshmikumar et al. | 331/57 |
| 7,863,991 | B1* | 1/2011 | Iravani | 331/57 |
| 7,924,102 | B2 | 4/2011 | Hinrichs | |
| 7,948,330 | B2 | 5/2011 | Seo et al. | |
| 7,956,695 | B1 | 6/2011 | Ding et al. | |
| 8,035,453 | B1* | 10/2011 | Wong et al. | 331/57 |
| 2007/0103242 | A1 | 5/2007 | Wu | |
| 2008/0252387 | A1 | 10/2008 | Higashi | |
| 2009/0206936 | A1* | 8/2009 | Fernandez et al. | 331/8 |
| 2009/0251171 | A1 | 10/2009 | Butts et al. | |
| 2009/0261909 | A1 | 10/2009 | Fujino | |
| 2010/0214033 | A1 | 8/2010 | Fleming et al. | |
| 2011/0148540 | A1 | 6/2011 | Nakano | |

OTHER PUBLICATIONS

International Search Report and Written Opinion—PCT/US2013/028714—ISA/EPO—May 23, 2013.
Abidi et al., "Phase Noise and Jitter in CMOS Ring Oscillators", IEEE Journal of Solid-State Circuits, vol. 41, No. 8, pp. 1803-1816 (Aug. 2006).
Cheng et al., "A 0.5-V 0.4-2.24-GHz inductorless phase-locked loop in a system-on-chip", IEEE Transactions on Circuits and Systems-I; Regular Papers, Vol. 58, No. 5, pp. 849-859 (May 2011).

* cited by examiner

*Primary Examiner* — Joseph Chang
*Assistant Examiner* — Jeffrey Shin
(74) *Attorney, Agent, or Firm* — Kenyon S. Jenckes

(57) ABSTRACT

A wide frequency, low voltage oscillator includes multiple delay elements, in which each delay element includes two inverters coupled through a latching element into a differential-type configuration. Two current-source PMOS devices bias the latching element in a high-gain region at low-voltage. By coupling these current-source PMOS devices into the delay elements, the start-up voltage of the latching element is reduced. Each delay element is also biased using a replica bias circuit that scales the supply/control voltage of the oscillator and provides the scaled supply/control voltage to control the lower rail of oscillation amplitude. By coupling the replica bias circuit to the lower rail, the lower rail of the oscillation amplitude follows the changes to the supply/control voltage.

20 Claims, 7 Drawing Sheets

LOW VOLTAGE, WIDE FREQUENCY RANGE OSCILLATOR

BACKGROUND

1. Field

Aspects of the present disclosure relate generally to voltage controlled oscillators (VCOs) and more specifically, to a low voltage, wide frequency range oscillator.

2. Background

In a conventional differential ring oscillator, the current output of each differential stage or cell generally takes a certain time to charge or discharge an input capacitance of the following stage to a threshold voltage. The differential stages are often coupled into a loop configuration such that, at a certain frequency, a 180 degrees phase shift may be imparted to signals travelling in the loop. If the loop gain is large enough, the signals become non-linear typically resulting in square wave oscillations.

Differential ring oscillators are widely used in mobile phones and other portable devices. In particular, differential ring oscillators are used in phase locked loops (PLLs) and in digital signal processors. Since mobile phones and other portable devices typically operate at a low voltage, PLLs in portable devices should also operate satisfactorily at a low voltage. Mobile phones and other portable devices also generally use batteries to supply their power. Thus, it is desirable that PLLs and other circuit components consume less power in order to increase efficiency and battery life. Because pseudo-differential ring oscillators consume less power than conventional differential ring oscillator for a given phase-noise performance, pseudo-differential oscillators are increasingly being used in mobile phones and other portable devices.

Advances in semiconductor fabrication technologies have increased the miniaturization of various integrated components. Nanometer-scaled electronics are now being used to implement such electronic components on a chip-level. However, nanometer technology operates at a lower voltage level than previous technology. Thus, a reduction of the minimum operating voltage will make pseudo-differential ring oscillators more suitable in such applications.

FIG. 1 shows a differential stage 100 of a pseudo-differential ring oscillator. It will be appreciated that a plurality of stages would be connected in a loop configuration to form a ring oscillator. The stage 100 includes first and second inverters 104 and 108 coupled between a voltage supply 106 and ground 110. The first inverter 104 comprises a P-channel transistor 116 and an N-channel transistor 120. The gates of the transistors 116 and 120 are interconnected to form an input node 150 to which an input signal Vin+ is applied. The drains of the transistors 116 and 120 are interconnected to form an output node 162. Responsive to the input signal Vin+, the first inverter 104 generates an output signal Vout− at the output node 162.

The second inverter 108 comprises a P-channel transistor 124 and an N-channel transistor 128 coupled between the voltage supply 106 and ground 110. The gates of the transistors 124 and 128 are interconnected to form a complementary input node 154 to which a complementary input signal Vin− is applied. The drains of the transistors 124 and 128 are interconnected to form a complementary output node 158. Responsive to the complementary input signal Vin−, the second inverter 108 generates a complementary output signal Vout+ at the complementary output node 158.

An N-channel latch 112 is coupled between the output 162 and the complementary output 158. The N-channel latch 112 comprises cross-coupled transistors 132 and 136. The gate of the transistor 132 is coupled to the drain of the transistor 136, and the gate of the transistor 136 is coupled to the drain of the transistor 132. Series connected capacitors 140 and 144 are coupled between the output node 162 and the complementary output node 158. The capacitors 140 and 144 interconnect at node 142, which can be used a secondary control node for the stage 100. While the N-channel latch 112 is illustrated in a half-latch configuration, it will be apparent to those skilled in the art that a full latch or a plurality of latches may be coupled between the output 162 and the complementary output 158.

The start-up of the stage 100 can be illustrated as follows. Assume Vt is the threshold voltage for all devices used in the stage 100. During start-up, the supply voltage, 106 is powered-up and increases from ground to a higher voltage level. As the supply voltage 106 is increased, the voltage on the output of the two inverters Vout+, Vout− tracks the supply voltage increase as k*Vsupply, where k is a factor determined by the leakage current ratios of PMOS and NMOS devices used in the design. For typical device sizing, k is usually about 0.5. In order for the ring to start oscillating, the latch 112 needs to be biased in a high-gain state so that the outputs of the two inverters are forced to be 180 degrees apart. This implies that the latch 112 input voltages, Vout+ and Vout−, should exceed Vt. Therefore, for a typical k=0.5, supply voltage should exceed 2Vt for the oscillator to start-up.

During oscillation, the operation of stage 100 can be explained as follows. In the initial operations, the input signal Vin+ is a signal having a value that is representative of the high state or as a logical 1 and the complementary input signal Vin− is a signal having a value that is represented as the low state or as a logical 0. Consequently, the P-channel transistor 116 is turned OFF, while the N-channel transistor 120 is turned ON. When Vin+ transitions to a logical 0, the N-channel transistor 120 is turned OFF, while the P-channel transistor 116 is turned ON, causing the output to switch to logical 1.

Referring now to the inverter 108, when the complementary input signal Vin− is a logical 0, the P-channel transistor 124 is turned ON, while the N-channel transistor 128 is turned OFF. Consequently, the complementary output signal Vout− becomes a logical 1. As the complementary input signal Vin− transitions to logical 1, the N-channel transistor 128 is turned ON, while the P-channel transistor 124 is turned OFF, causing the complementary output signal Vout− to become a logical 0.

Referring now to the N-channel latch 112, when the output signal Vout+ is a logical 1, the N-channel transistor 136 is turned ON, thereby pulling the complementary output Vout− to a logical 0. Consequently, the N-channel transistor 132 is turned OFF. When Vout− transitions to logical 1, the N-channel transistor 162 is turned ON, thereby pulling Vout+ to logical 0, which causes the transistor 136 to turn OFF. Thus, the N-channel latch 112 maintains a 180-degree phase shift between the output Vout+ and the complementary output Vout−.

It will be appreciated that the output frequency of a conventional pseudo-differential ring oscillator varies with the supply voltage 106. Since the minimum operating voltage is 2*Vt, the conventional pseudo-differential ring oscillator has a limited frequency range at its low-end. Further, since the amplitude of oscillation increases with the control voltage and thus, oscillation frequency, the frequency range is also limited at its high-end by an increasing oscillation amplitude.

SUMMARY

Representative aspects of the present disclosure are directed to a wide frequency, low voltage oscillator. Each delay element of the oscillator includes two inverters coupled through a latching element into a differential configuration. In addition to this configuration, two P-channel transistors are added for biasing the latching element in a high-gain region at low-voltage. By coupling these P-channel transistors, the start-up voltage of the latching element is reduced, for example, from ~2Vt to ~Vt.

Each delay element in the oscillator is also biased using a replica bias circuit that scales the supply/control voltage of the oscillator and provides the scaled supply/control voltage to control the two current-source PMOS devices to set the lower rail of oscillation amplitude such that it scales with the supply/control voltage. By coupling the current in the two current-source PMOS devices to the supply/control voltage, the lower end of the output oscillation rises and falls with changes to the supply/control voltage. This will at least limit the amplitude of the oscillation or, depending on the configuration of the replica biasing circuit, provide a constant amplitude to the resulting oscillation regardless of the amplitude of the supply/control voltage.

In one aspect of the disclosure, a voltage controlled oscillator (VCO) includes a plurality of differential stages connected in a loop. A differential stage includes a replica bias circuit that scales a supply/control voltage of the oscillator and provides the scaled supply/control voltage to control two P-channel transistors to set the lower rail of oscillation amplitude such that it scales with the supply/control voltage. The stage also includes a first differential inverter coupled to the voltage supply. The first differential inverter has a first input and a first output. The stage also includes a second differential inverter coupled to the voltage supply. The second differential inverter has a second input and a second output.

The stage also includes a latch circuit coupled between the first and second outputs. The latch circuit is configured to maintain a 180-degree phase shift between the first and second outputs. The first and second P-channel transistors bias the latch circuit to activate when the voltage supply exceeds a threshold voltage.

In an additional aspect of the disclosure, the replica bias circuit includes a voltage divider coupled to a unity gain amplifier. The voltage divider also includes a third P-channel transistor coupled between the voltage supply and the unity gain amplifier. The third P-channel transistor has a gate to which is coupled the gates of the first and second P-channel transistors.

In an additional aspect of the disclosure, the latch circuit includes first and second N-channel transistors. The first N-channel transistor is coupled to the first output and a gate of the first N-channel transistor is coupled to the second output. The second N-channel transistor is coupled to the second output and a gate of the second N-channel transistor is coupled to the first output.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The word "exemplary" is used herein to mean "serving as an example, instance, or illustration." Any embodiment or aspect described herein as "exemplary" is not necessarily to be construed as preferred or advantageous over other embodiments or aspects. In addition, references to "an," "one," "other," or "various" embodiments or aspects should not be construed as limiting since various aspects of the disclosed embodiments may be used interchangeably within other embodiments.

Figure 1:
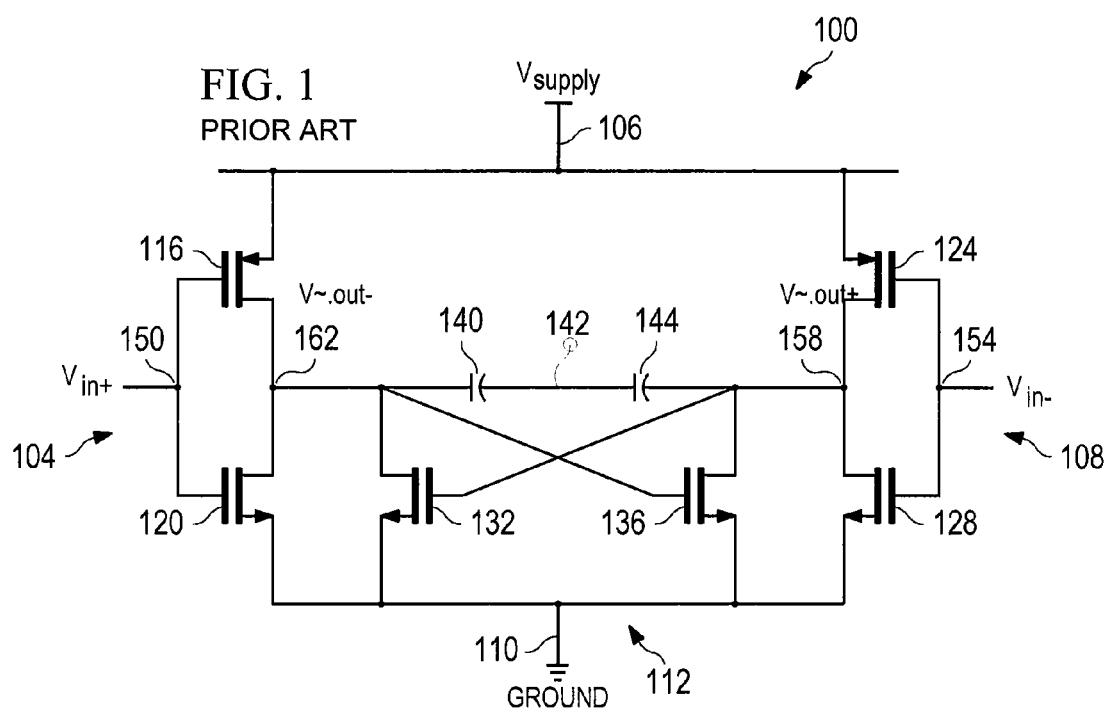
FIG. 1 is a circuit diagram illustrating a differential stage of a conventional pseudo-differential ring oscillator.
Figure 2A:
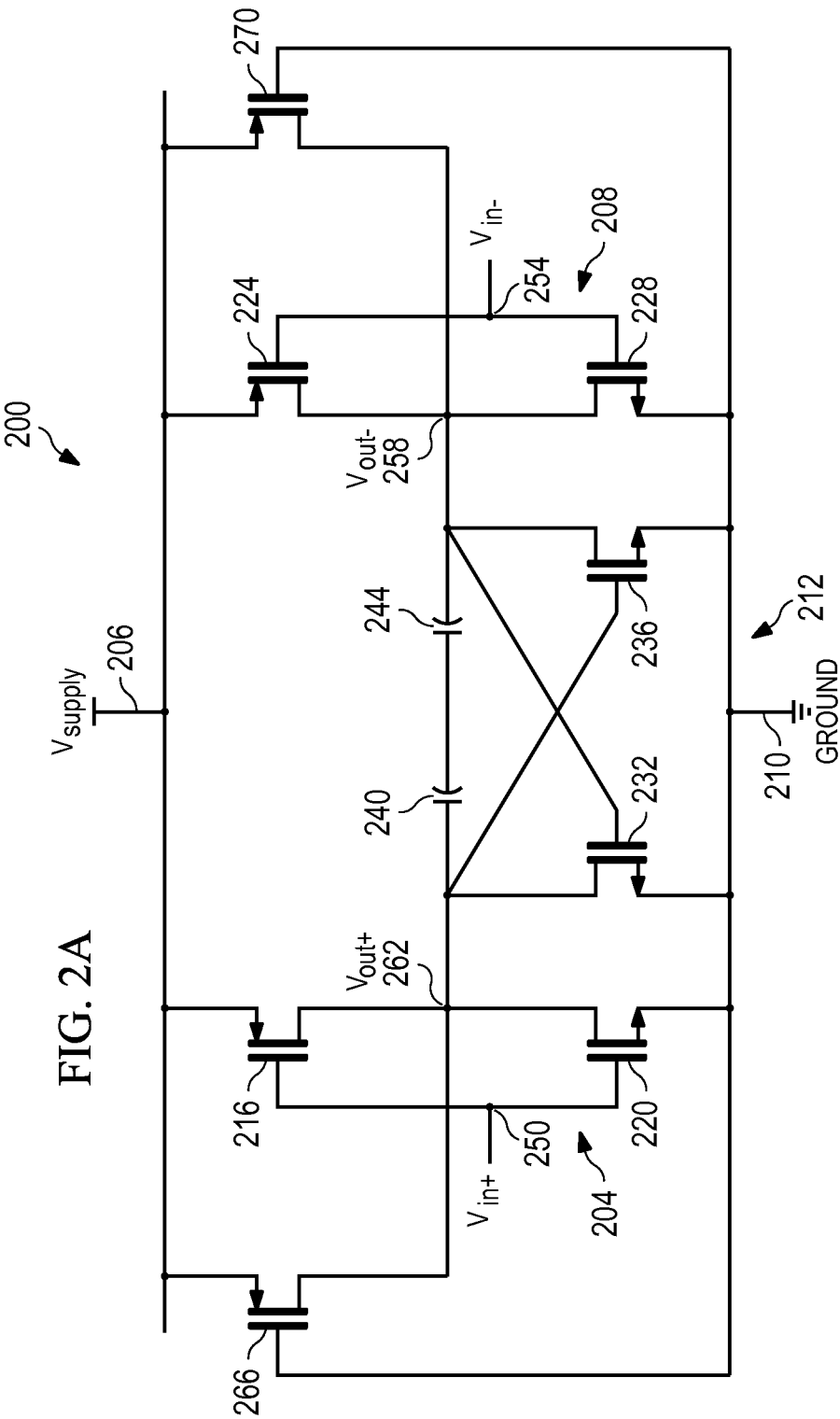
FIG. 2A is a circuit diagram illustrating a differential stage of a pseudo-differential ring oscillator in accordance with one aspect of the disclosure.

FIG. 2A shows a differential stage 200 of a pseudo-differential ring oscillator in accordance with one aspect of the disclosure. The differential stage 200 is also referred to herein as a delay element. The differential stage 200 comprises first and second inverters 204 and 208 coupled between a voltage supply 206 and ground 210. The first inverter 204 includes a P-channel transistor 216 and an N-channel transistor 220. The gates of the transistors 216 and 220 are interconnected to form an input node 250 to which an input signal Vin+ would be applied. The drains of the transistors 216 and 220 are interconnected to form an output node 262. In operation, responsive to an input signal Vin+, the first inverter 204 generates an output signal Vout+ at the output node 262.

The second inverter 208 includes a P-channel transistor 224 and an N-channel transistor 228 coupled between the voltage supply 206 and ground 210. The gates of the transistors 224 and 228 are interconnected to form a complementary input node 254 to which a complementary input signal Vin− is applied. The drains of the transistors 224 and 228 are interconnected to form a complementary output node 258. In operation, responsive to the complementary input signal Vin−, the second inverter 208 generates a complementary output signal Vout− at the complementary output node 258.

Figure 2B:
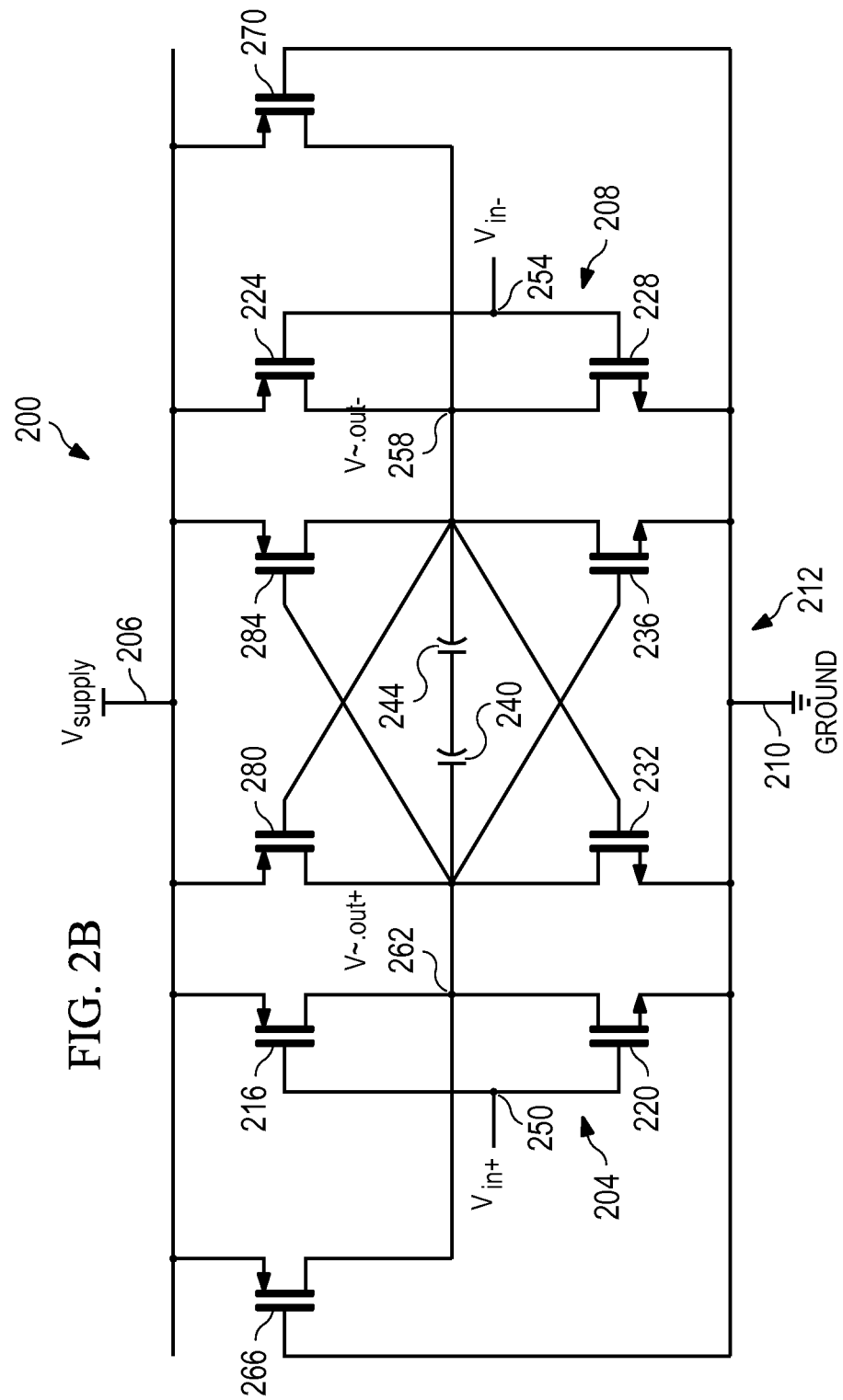
FIG. 2B is a circuit diagram illustrating a differential stage of a pseudo-differential ring oscillator in accordance with another aspect of the disclosure.

An N-channel latch 212 is coupled between the output node 262 and to the complementary output node 258. The N-channel latch 212 comprises cross-coupled transistors 232 and 236. The gate of the transistor 232 is coupled to the drain of the transistor 236, and the gate of the transistor 236 is coupled to the drain of the transistor 232. Series connected capacitors 240 and 244 are coupled between the output node 262 and the complementary output node 258. The N-channel latch 212 shown in FIG. 2A is a half-latch. It will be apparent to those skilled in the art that a full-latch or a plurality of latches can be used in the differential stage 200. FIG. 2B shows the differential stage 200 with a full latch formed by the N-channel transistors 232 and 236 and two P-channel transistors 280 and 284.

Unlike the conventional oscillator configuration, the differential stage 200 includes a P-channel transistor 266 coupled between the voltage supply 206 and the output node 262. The gate of the P-channel transistor 266 is grounded. Similarly, a P-channel transistor 270 is coupled between the voltage supply 206 and the complementary output node 258. The gate of the P-channel transistor 270 is also grounded.

It should be noted that because the gates of the transistors 266 and 270 are grounded, the P-channel transistors 266 and 270 will be turned ON during circuit operation. Consequently, as the supply voltage is raised to the threshold voltage, Vt, the N-channel transistors 232 and 236 are biased in the high gain region, thereby causing the latch 212 to be activated. Thus, the stage 200 may operate when the supply voltage reaches the threshold voltage, Vt, rather than twice the threshold voltage (2*Vt) in the conventional oscillators. This allows the stage 200 to generate output signals having a lower minimum frequency, Fmin. Since the P-channel transistors 266 and 270 activate the N-channel latch 212 at a lower supply voltage, Vt, the minimum frequency Fmin is lowered, thereby increasing the frequency range of the stage 200. Also, since the stage 200 may operate at a lower voltage, the stage 200 is suitable in nanometer technology.

Figure 3A:
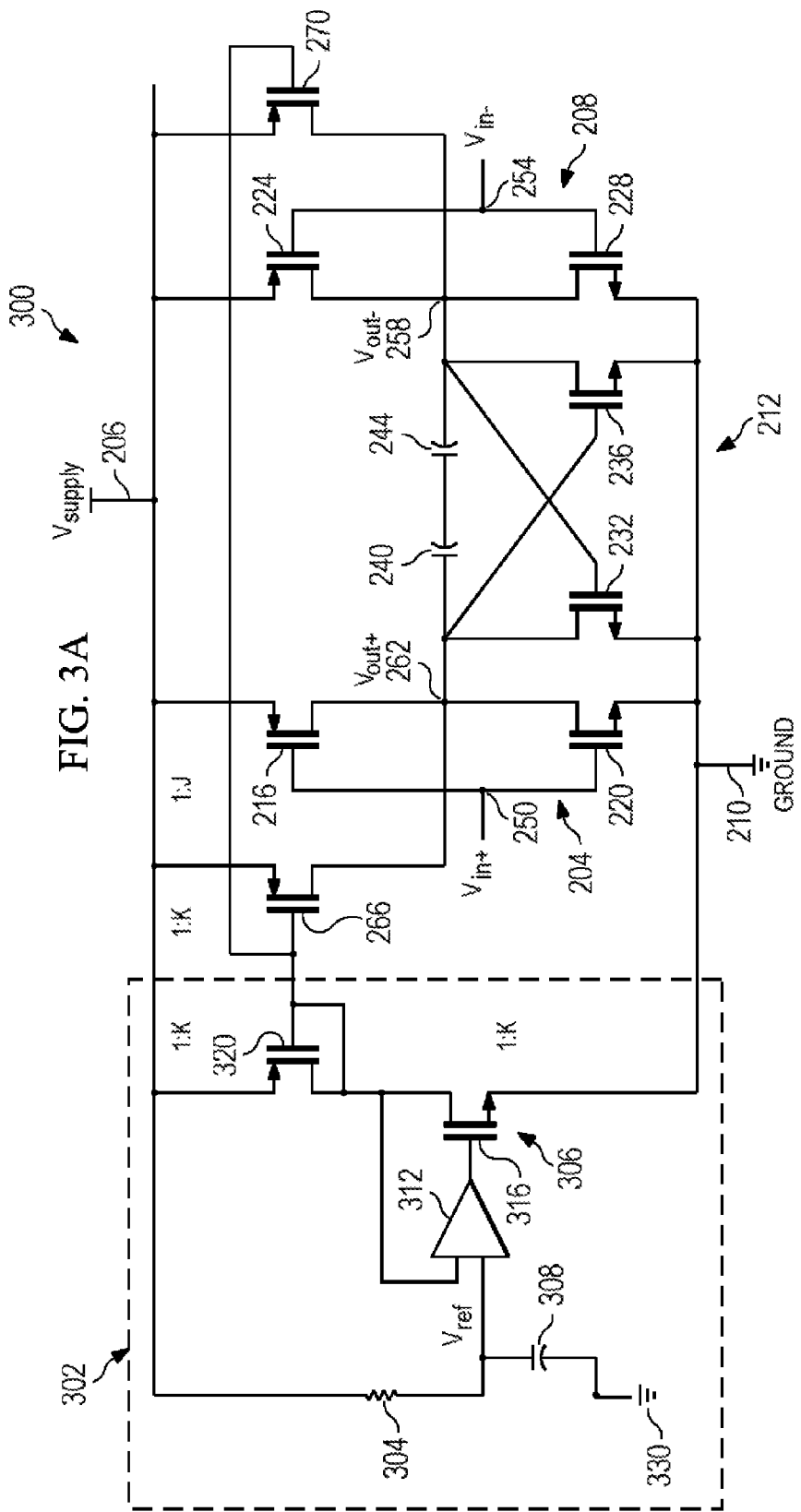
FIG. 3A is a circuit diagram illustrating a differential stage of a pseudo-differential ring oscillator in accordance with yet another aspect of the disclosure.

FIG. 3A shows a differential stage 300 of a pseudo-differential ring oscillator in accordance with another aspect of the disclosure. The differential stage 300 is similar to the differential stage 200 shown in FIG. 2A except that a replica bias circuit 302 is added to control the operation of the P-channel transistors 266 and 270 and to scale the lower rail of oscillation amplitude with supply/control voltage. The replica bias circuit 302 includes a voltage divider 304 coupled between the supply voltage 206 and ground 330. The voltage divider 304, which is connected in parallel to a capacitor 308, generates a reference voltage, Vref, that is proportional to the supply voltage 206. The reference voltage, Vref, is applied to a voltage follower/unity gain amplifier 306 which may comprise an operational amplifier 312 and an N-channel transistor 316.

Figure 3B:
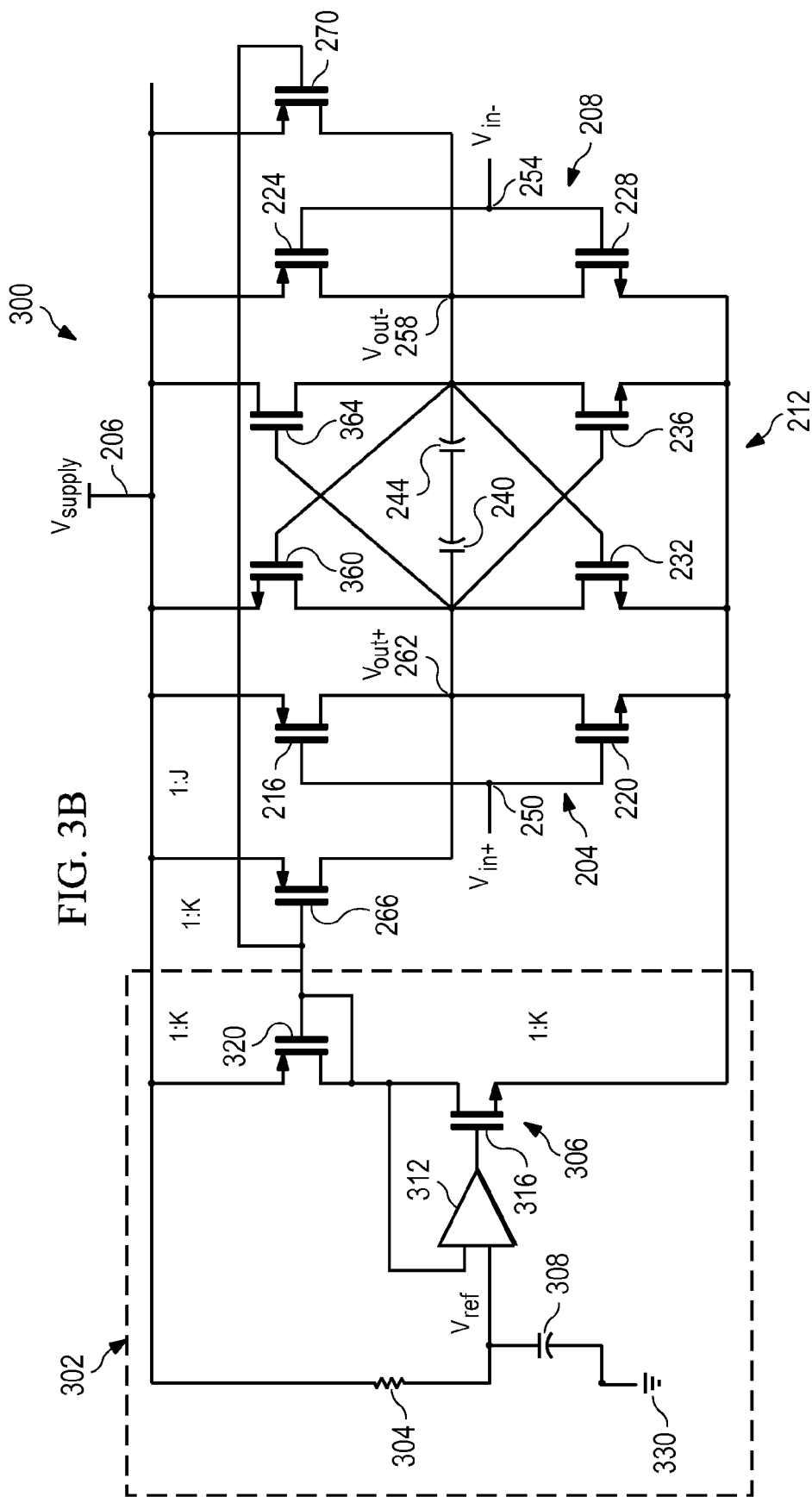
FIG. 3B is a circuit diagram illustrating a differential stage of a pseudo-differential ring oscillator in accordance with yet another aspect of the disclosure.

The replica bias circuit 302 includes a P-channel transistor 320 coupled to the transistors 266 and 270 in a current mirror configuration. Consequently, current flowing through the transistors 266 and 270 are controlled by the replica bias circuit 302. The replica bias circuit 302 generates a current that scales with the supply/control voltage and the current is mirrored over to PMOS devices 266 and 270. This current flows through the NMOS devices 220/228 when either of these devices turn ON during different phases of oscillation. This additional current through NMOS devices 220, 228 limits their drain voltage, which in-turn determines the lower rail of oscillation amplitude. Since the current through PMOS devices 266 and 270 scales with the supply/control voltage, the lower rail of oscillation amplitude also scales accordingly. In other words, by permitting the lower rail of the oscillation amplitude to rise with the supply voltage, the swing of the output signal is held constant, thus, allowing the output signal to achieve a higher maximum frequency. The swing of the output signal is defined herein as the difference between the maximum amplitude and the minimum amplitude. Since, for a given current, the frequency of a ring oscillator is inversely proportional to the amplitude of the output signal, limiting the oscillation amplitude results in higher frequency. Also, since the P channel transistors 266 and 270 bias the N-channel transistors 232 and 236 in a high gain region at a lower voltage, a lower start-up voltage is used for activation, which makes the differential stage 300 suitable in nanometer technology. However, because the replica circuit 302 includes the voltage divider 304 and the operational amplifier 312, the differential stage 300 will consume more power than the stage 200 (FIG. 200). Thus, while the differential stage 300 may operate at a higher frequency than the stage 200, there is a tradeoff in power consumption with the differential stage 300. FIG. 3B shows the differential stage 300B with a full latch formed by the N-channel transistors 232 and 236 and two P-channel transistors 360 and 364.

Figure 3C:
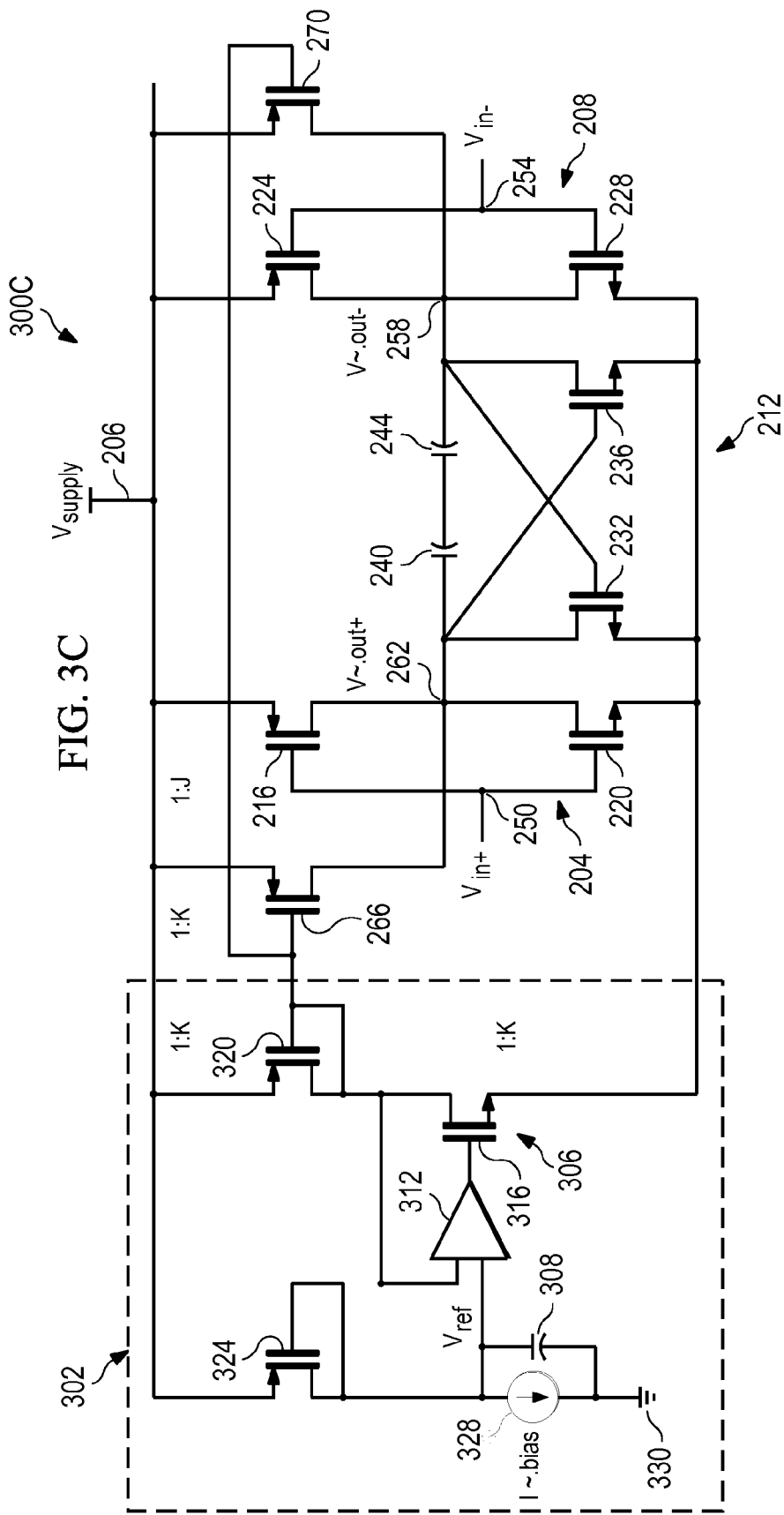
FIG. 3C is a circuit diagram illustrating a differential stage of a pseudo-differential ring oscillator in accordance with yet another aspect of the disclosure.

FIG. 3C shows a differential stage 300C of a pseudo-differential ring oscillator in accordance with yet another aspect of the disclosure. The differential stage 300C includes two P-channel transistors 320 and 324. It will be appreciated that the lower rail of the oscillator amplitude is equal to Vsupply−Vgs, where Vgs is the gate-to-source voltage of the P-channel transistor 324. Assuming a large Rds for the P-channel transistor 324, Vgs is constant with varying supply for a given replica circuit. Therefore, the replica circuit reference voltage, Vref, and consequently the lower-rail of oscillation amplitude closely track the supply voltage changes. Thus, the circuit configuration of differential stage 300C provides for a constant amplitude oscillation. The various aspects of the present disclosure are not limited to any one particular circuit design.

It should further be noted that variations in circuit performance may be achieved through design of the sizing ratios between the various transistors of the circuit stage. For example, the sizing ratios P-channel transistors in the replica circuit and the N-channel transistors in the latch 212 may determine how the lower rail of the oscillation amplitude tracks the supply voltage. The sizing ratios are indicated in FIGS. 3A-3C as 1:K for the ratios between the transistors of the replica circuit 302 and the differential stage 300, and as 1:J for the ratios between the transistors of the differential stage 300. Accordingly, the expected performance attributes of a given oscillator may be designed through appropriate sizing ratios of the transistors in each stage of the oscillator.

Figure 4:
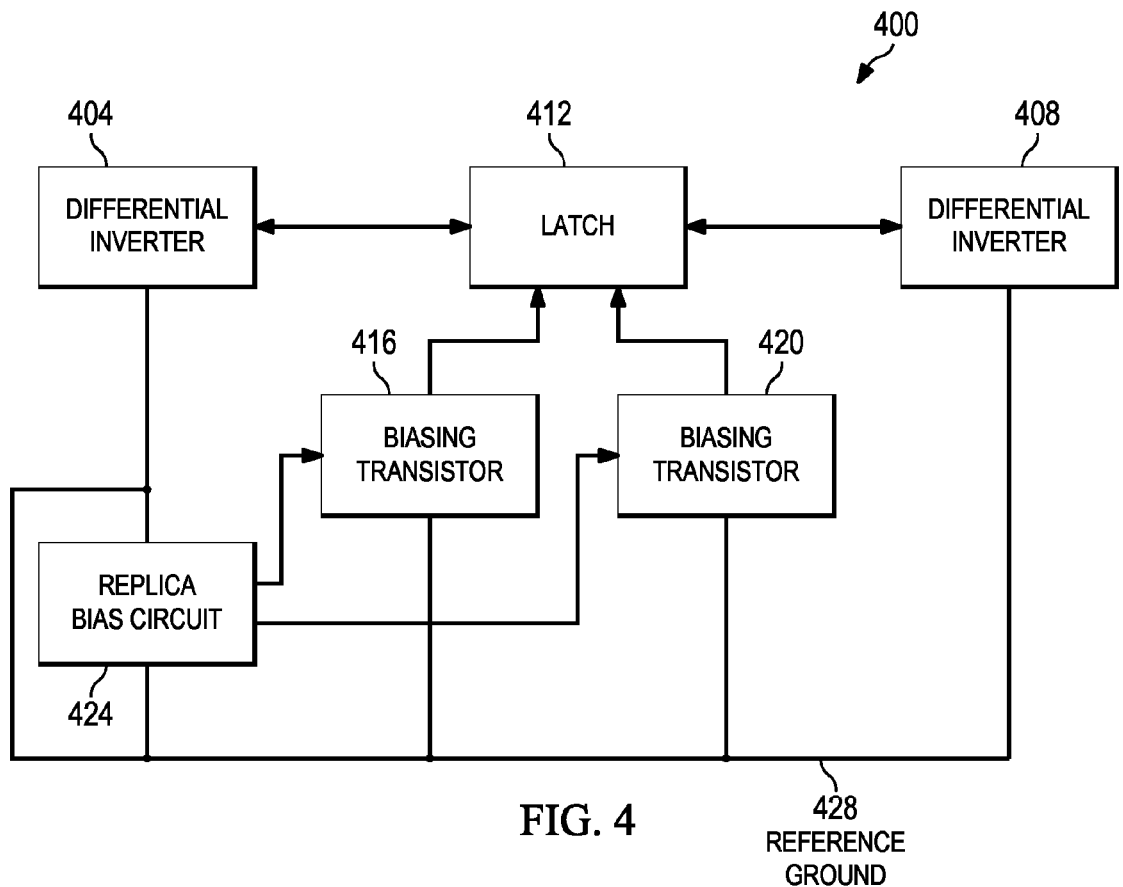
FIG. 4 is a block diagram illustrating a differential stage in accordance with an aspect of the disclosure.

FIGS. 3A-3C illustrate several circuit configurations that may be used to implement aspects of the present disclosure. It should be noted, however, that the various aspects and alternatives of the present disclosure are not limited to any certain circuit configuration. FIG. 4 shows a block diagram of a differential stage 400 in accordance with one aspect of the disclosure. The stage 400 includes differential inverters 404 and 408 coupled to a latch 408. Biasing transistors 416 and 420 bias the latch 412 to lower the start-up voltage as described previously. A replica bias circuit 424 controls the biasing transistors 416 and 420 and also controls the lower rail of the oscillation amplitude as explained above. Also as explained before, the biasing transistors 416 and 420 enable the stage 400 to operate when the supply voltage reaches a threshold voltage Vt, rather than twice the threshold voltage 2*Vt in conventional oscillators, thus allowing the stage 400 operate at a lower voltage.

Figure 5:
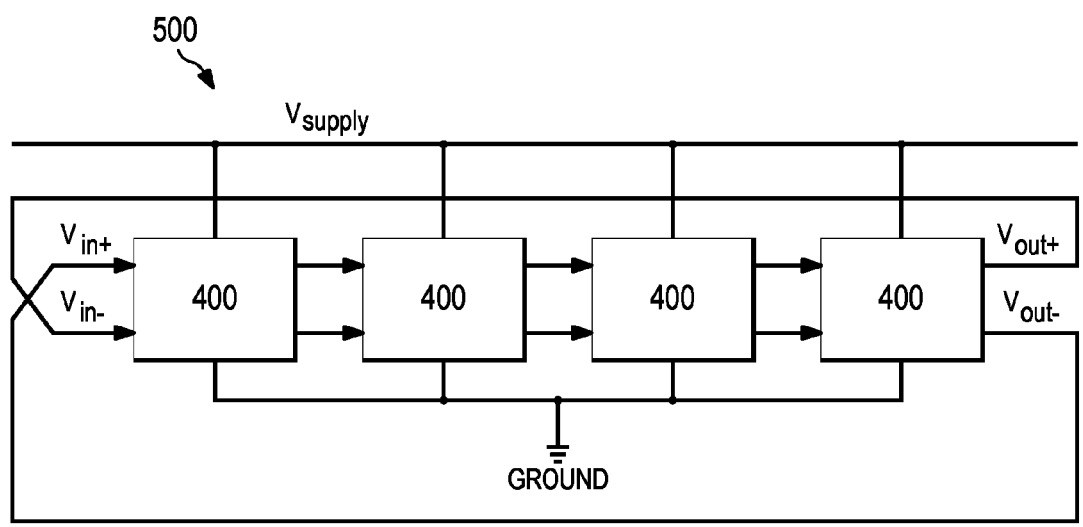
FIG. 5 is a block diagram illustrating a differential ring oscillator in accordance with an aspect of the disclosure.

FIG. 5 shows a block diagram of a differential ring oscillator 500 in accordance with an embodiment of the disclosure. The differential ring oscillator comprises a series of differential stages 400 connected in a loop. Responsive to an input signal Vin+ and a complementary input signal Vin−, each stage generates an output signal Vout+ and a complementary output signal Vout−. The differential ring oscillator 500 operates when the supply voltage reaches a threshold voltage Vt, rather than twice the threshold voltage 2*Vt in conventional ring oscillators. Also, the lower rail of the oscillation amplitude is controlled by a replica bias circuit (shown in FIGS. 3A-3C) to increase the frequency range of the ring oscillator 500.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A ring oscillator comprising:
   a control input configured to receive a control voltage;
   a plurality of delay elements coupled together in a ring configuration, each of the plurality of delay elements coupled to the control input, and each of the plurality of delay elements comprising:
      first and second inverters arranged in a differential configuration;
      a latching element coupling the first and second inverters; and
      a plurality of current-source devices coupled to the latching element, wherein, when activated, the plurality of current-source devices biases the latching element in a high-gain region and wherein transistor gates of the plurality of current-source devices are coupled to ground.

2. The ring oscillator of claim 1, further comprising a replica bias circuit coupled to the control input and each of the plurality of delay elements, the replica bias circuit providing a scaled control voltage to control the plurality of current-source devices and providing the scaled control voltage to in-turn scale a lower-rail of oscillation amplitude.

3. The ring oscillator of claim 2 wherein the replica bias circuit is configured to create a constant amplitude output of the ring oscillator.

4. The ring oscillator of claim 2 wherein performance characteristics of a first set of active devices of the replica bias circuit based on performance characteristics of a first set of active devices of the plurality of delay elements.

5. The ring oscillator of claim 2 wherein performance characteristics of a second set of active devices of the replica bias circuit are based on performance characteristics of a second set of active devices of the plurality of current-source devices.

6. A voltage controlled oscillator (VCO) comprising a plurality of stages connected in a loop, each stage comprising:
   a first differential inverter coupled between a voltage supply and ground, the first differential inverter having a first input and a first output;
   a second differential inverter coupled between the voltage supply and ground, the second differential inverter having a second input and a second output;
   a latch circuit coupled between the first and second outputs, the latch circuit configured to maintain a 180-degree phase shift between the first and second outputs;
   a first P-channel transistor coupled between the voltage supply and the first output, wherein a gate of the P-channel transistor is coupled to ground; and
   a second P-channel transistor coupled between the voltage supply and the second output, wherein a gate of the second P-channel transistor is coupled to ground,
   wherein the first and second P-channel transistors bias the latch circuit to activate when the voltage supply exceeds a threshold voltage.

7. The VCO of claim 6, wherein the latch circuit comprises two cross-coupled N-channel transistors.

8. The VCO of claim 6, wherein the latch circuit comprises first and second N-channel transistors, the first N-channel transistor coupled between the first output and ground and wherein a gate of the first N-channel transistor is coupled to the second output, the second N-channel transistor coupled between the second output and ground and wherein a gate of the second N-channel transistor is coupled to the first output.

9. The VCO of claim 6, wherein the latch circuit comprises two cross-coupled P-channel transistors.

10. The VCO of claim 6, wherein the latch circuit comprises a third and fourth cross-coupled P-channel transistor, the third P-channel transistor coupled between the voltage supply and the first output and wherein a gate of the third P-channel transistor is coupled to the second output, the fourth P-channel transistor coupled between the voltage supply and the second output and wherein a gate of the fourth P-channel transistor is coupled to the first output.

11. A voltage controlled oscillator (VCO) comprising a plurality of stages connected in a loop, each stage comprising:
    a first differential inverter coupled to a voltage supply and having a first input and a first output;
    a second differential inverter coupled to the voltage supply and having a second input and a second output;
    a latch circuit coupled to the first and second outputs, the latch circuit configured to maintain a 180-degree phase shift between the first and second outputs;
    a first and a second P-channel transistor coupled respectively between the voltage supply and the first output and the voltage supply and the second output, the first and second P-channel transistors biasing the latch circuit to activate when the voltage supply exceeds a threshold voltage; and
    a bias circuit configured to receive the voltage supply and operable to control the first and second P-channel transistors, the bias circuit controlling a lower rail of an oscillation amplitude.

12. The VCO of claim 11, wherein the lower rail of oscillation amplitude scales with the voltage supply.

13. The VCO of claim 11, wherein the bias circuit comprises a voltage divider coupled to a unity gain amplifier for controlling the lower rail of oscillation amplitude responsive to the voltage supply.

14. The VCO of claim 13, wherein the bias circuit comprises a third P-channel transistor coupled between the voltage supply and the unity gain amplifier, wherein the third P-channel transistor having a gate to which is coupled the gates of the first and second P-channel transistors.

15. A voltage controlled oscillator (VCO) comprising a plurality of stages connected in a loop, each stage comprising:
    a bias circuit configured to receive a voltage supply and responsive to the voltage supply operable to control a lower rail of oscillation amplitude;
    a first differential inverter coupled between the voltage supply and the bias circuit, the first differential inverter having a first input and a first output;

a second differential inverter coupled between the voltage supply and the bias circuit, the second differential inverter having a second input and a second output;

a latch circuit coupled between the first and second outputs, the latch circuit configured to maintain a 180-degree phase shift between the first and second outputs;

a first P-channel transistor coupled between the voltage supply and the first output;

a second P-channel transistor coupled between the voltage supply and the second output;

wherein the first and second P-channel transistors bias the latch circuit to activate when the voltage supply exceeds a threshold voltage.

16. The VCO of claim 15, wherein the bias circuit applies a gate voltage to gates of the first and second P-channel transistors to control the first and second P-channel transistors.

17. The VCO of claim 15, wherein the lower rail of oscillation amplitude is proportional to the voltage supply.

18. The VCO of claim 15, wherein the bias circuit comprises a voltage divider coupled to a unity gain amplifier for controlling the lower rail of oscillation amplitude responsive to the voltage supply.

19. The VCO of claim 15, wherein the bias circuit comprises a third P-channel transistor coupled between the voltage supply and the unity gain amplifier, wherein the third P-channel transistor having a gate to which is coupled the gates of the first and second P-channel transistors.

20. The ring oscillator of claim 1, wherein the latching element is activated when a supply voltage for the plurality of current-source devices reaches a threshold voltage for a transistor of the latching element.

* * * * *